United States Patent
Hegde

(10) Patent No.: US 10,409,514 B2
(45) Date of Patent: Sep. 10, 2019

(54) IP MULTICAST MESSAGE TRANSMISSION FOR EVENT NOTIFICATIONS

(71) Applicant: International Business Machines Corporation, Armonk, NY (US)

(72) Inventor: Harsha Hegde, Hawthorn Woods, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 193 days.

(21) Appl. No.: 15/332,557

(22) Filed: Oct. 24, 2016

(65) Prior Publication Data

US 2017/0155520 A1 Jun. 1, 2017

Related U.S. Application Data

(60) Provisional application No. 62/260,743, filed on Nov. 30, 2015.

(51) Int. Cl.
*G06F 16/25* (2019.01)
*G06F 3/06* (2006.01)
(Continued)

(52) U.S. Cl.
CPC ............ *G06F 3/0635* (2013.01); *G06F 3/064* (2013.01); *G06F 3/067* (2013.01); *G06F 3/0611* (2013.01); *G06F 3/0617* (2013.01); *G06F 3/0619* (2013.01); *G06F 3/0659* (2013.01); *G06F 11/0727* (2013.01); *G06F 11/1076* (2013.01); *G06F 11/1092* (2013.01); *G06F 16/258* (2019.01); *H03M 13/1515* (2013.01);
(Continued)

(58) Field of Classification Search
None
See application file for complete search history.

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Nicholas Sloms
(74) *Attorney, Agent, or Firm* — Garlick & Markison; Timothy W. Markison; Randy W. Lacasse

(57) ABSTRACT

A method for a dispersed storage network (DSN) begins when storing data associated with a vault, by identifying a multicast IP address associated with the vault. The method continues by generating and sending a multicast IP message to a plurality of storage units of the DSN and extracting, by each storage unit receiving the multicast IP message, the multicast IP address. The method continues when the extracted IP address compares favorably to a subscribed IP address, by storing, by the storage unit, the one or more encoded data slices for storage and the corresponding slice name for each encoded data slice. The method continues by each storage unit issuing a status multicast IP message. The method continues when an extracted IP address of a plurality of received status multicast IP messages compares favorably to a subscribed IP address, by executing an associated task.

16 Claims, 6 Drawing Sheets

(51) Int. Cl.

| | | |
|---|---|---|
| *G06F 11/10* | (2006.01) | |
| *G06F 11/07* | (2006.01) | |
| *H04L 29/08* | (2006.01) | |
| *H03M 13/15* | (2006.01) | |
| *H03M 13/00* | (2006.01) | |
| *H04L 12/18* | (2006.01) | |
| *H03M 13/37* | (2006.01) | |

(52) U.S. Cl.
CPC ..... *H03M 13/3761* (2013.01); *H03M 13/616* (2013.01); *H04L 12/18* (2013.01); *H04L 67/1008* (2013.01); *H04L 67/1097* (2013.01); *H04L 67/2823* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 8,370,567 | B1* | 2/2013 | Bonwick ............... G06F 3/0688 711/103 |
| 8,407,377 | B1* | 3/2013 | Shapiro ............. G06F 15/17331 709/203 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2011/0010441 | A1* | 1/2011 | Gutierrez ............ H04L 12/1868 709/223 |
| 2013/0108048 | A1* | 5/2013 | Grube ................... H04W 12/00 380/270 |
| 2014/0281817 | A1* | 9/2014 | Grube ................ G06F 11/1076 714/769 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

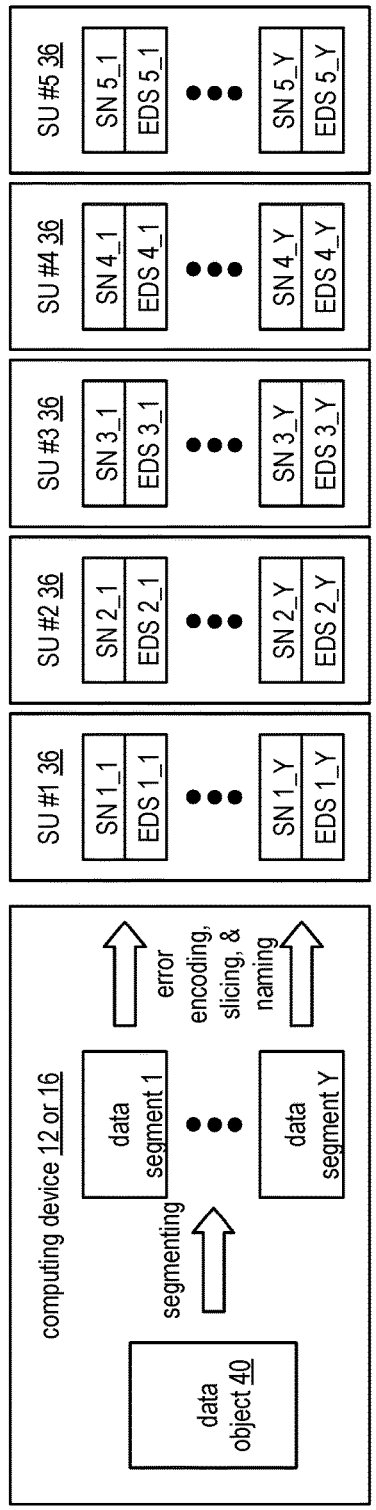
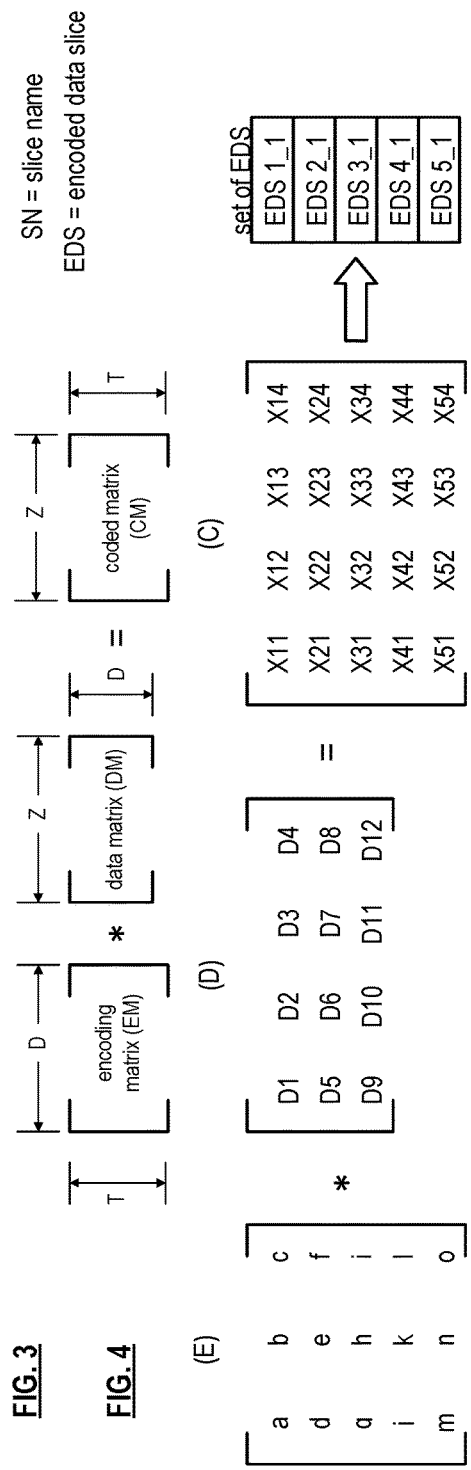
FIG. 3
FIG. 4
FIG. 5
FIG. 6

IP MULTICAST MESSAGE TRANSMISSION
FOR EVENT NOTIFICATIONS

CROSS-REFERENCE TO RELATED
APPLICATIONS

The present U.S. Utility Patent Applications claims priority pursuant to 35 U.S.C. § 119(e) to U.S. Provisional Application No. 62/260,743, entitled "COMMUNICATING DISPERSED STORAGE NETWORK STORAGE UNIT TASK EXECUTION STATUS," filed Nov. 30, 2015, which is hereby incorporated herein by reference in its entirety and made part of the present U.S. Utility Patent Applications for all purposes.

STATEMENT REGARDING FEDERALLY
SPONSORED RESEARCH OR DEVELOPMENT

Not applicable.

INCORPORATION-BY-REFERENCE OF
MATERIAL SUBMITTED ON A COMPACT
DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL
VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE
INVENTION

Figure 1:
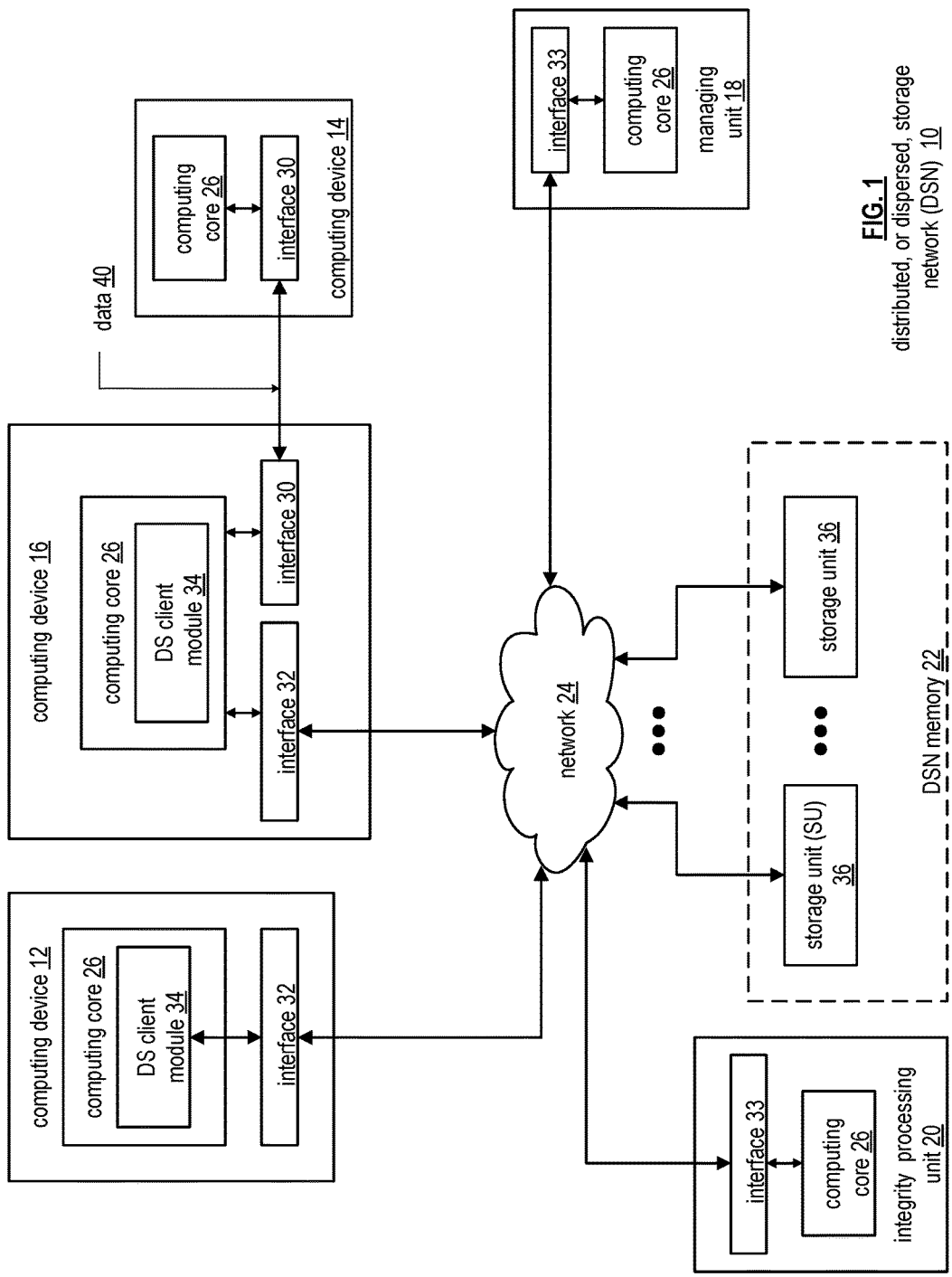
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
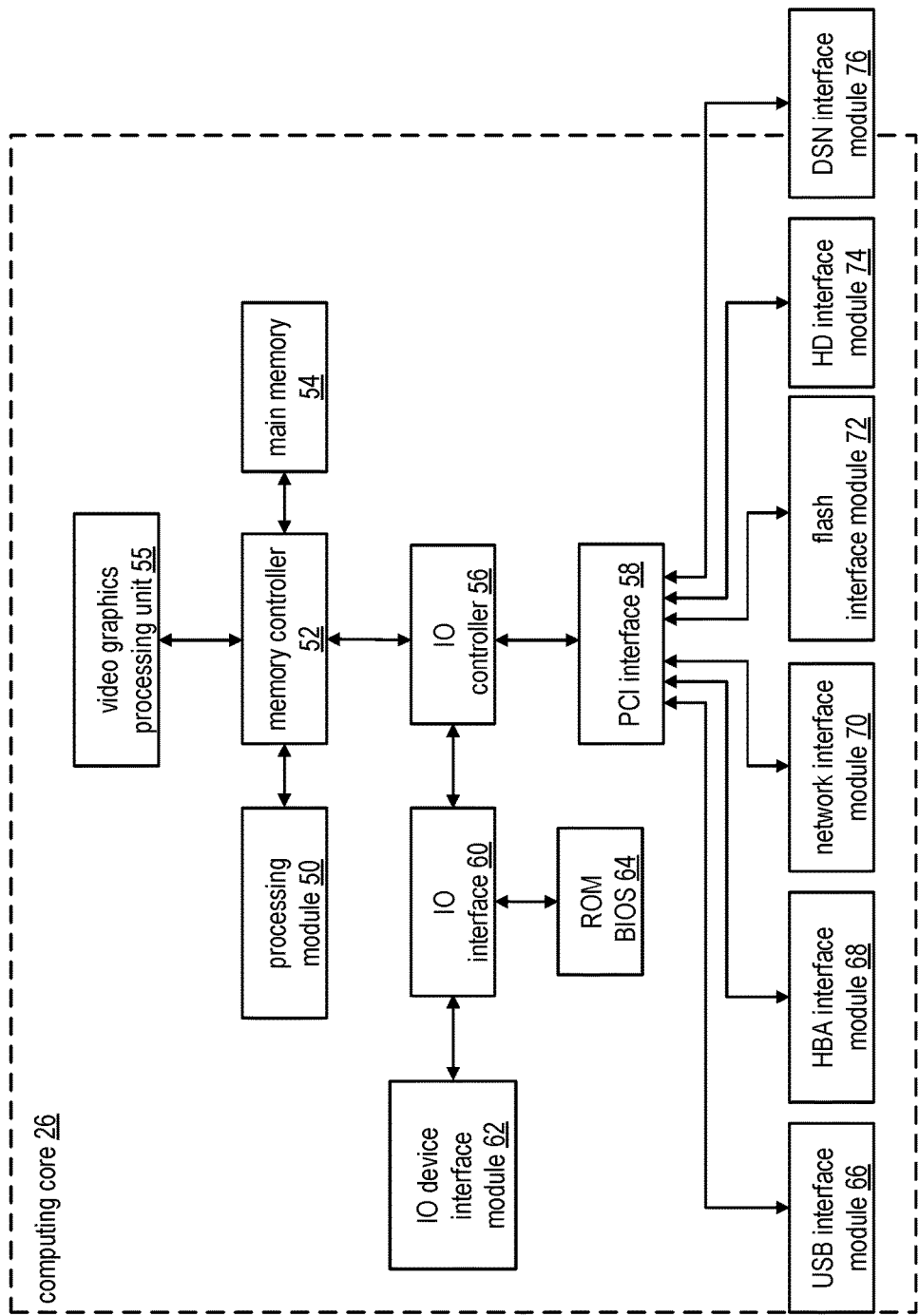
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the distributed storage and task network (DSTN) memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate per-access billing information. In another instance, the DSTN managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1–T), a data segment number (e.g., one of 1–Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
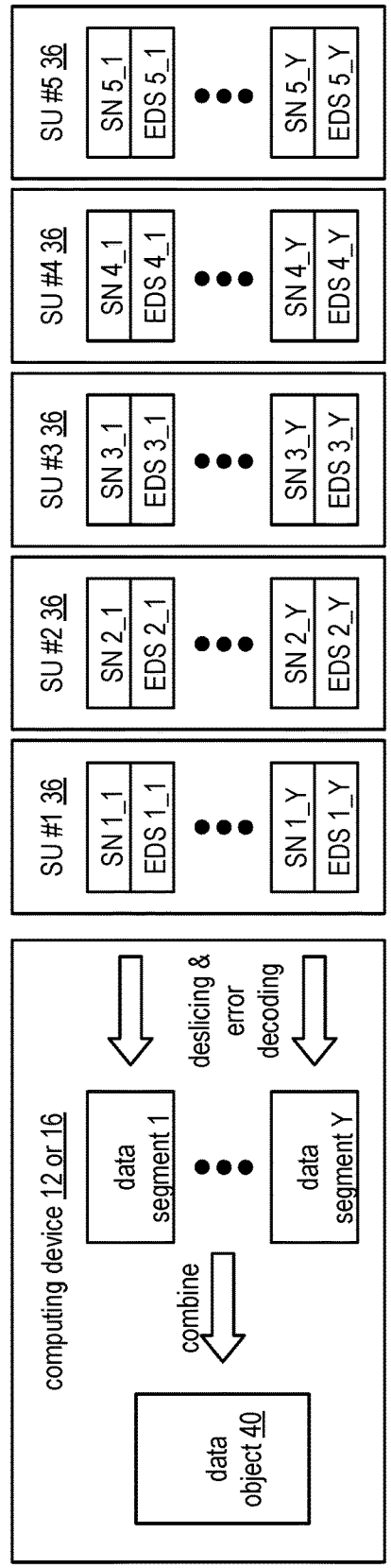
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

In one embodiment, a DS unit within a DSN memory can automatically transmit an IP multicast message to a specific multicast group address for specific events like write or delete at the vault and object level. The messages are sent to specific multicast groups at the time when the DSN memory unit completes a write or delete of an object to a vault. These messages notify explicit events to the recipients, which could help trigger other actions. The follow-up actions triggered upon the reception of the IP multicast event notification may include, for example, reading a newly written object to a vault or unsubscribing from certain multicast groups based on vault or object deletions.

Figure 9:
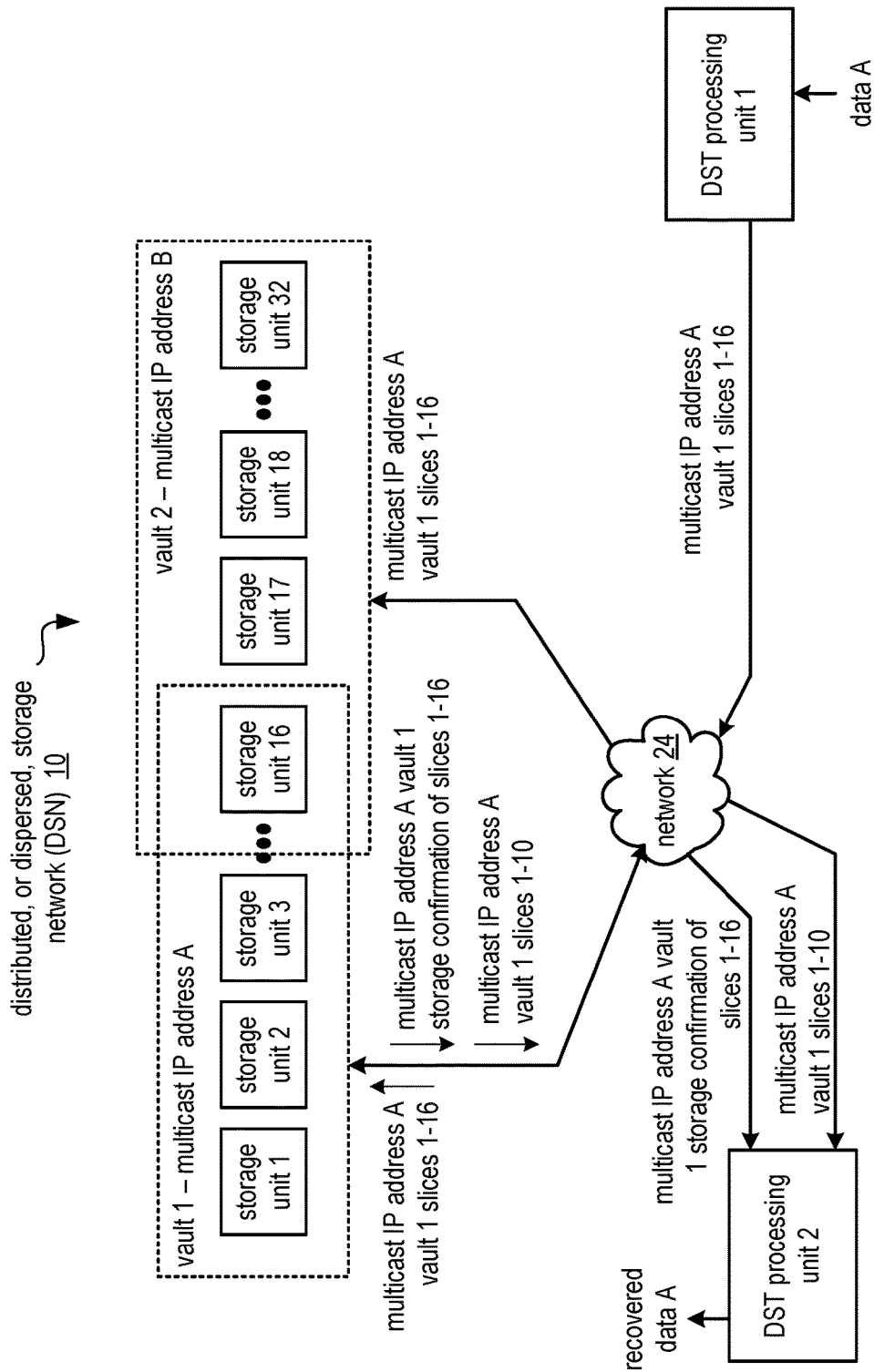
FIG. 9 is a schematic block diagram of another embodiment of a dispersed storage network (DSN) that includes a plurality of storage units in accordance with the present invention.

FIG. 9 is a schematic block diagram of another embodiment of a dispersed storage network (DSN) that includes a plurality of storage units, the network 24 of FIG. 1, and distributed storage and task (DST) processing units 1-2. Each DST processing unit (DST processing units 1 and 2) may be implemented utilizing the DST processing unit 16 (Computing device) of FIG. 1. A first set of storage units (e.g., SUs 36) of the plurality of storage units are affiliated with a first vault and a second set of storage units (e.g., SUs 36) of the plurality of storage units are affiliated with a second vault, where vaults are utilized to store data of a common association (e.g., data from a common group of users), and where data is dispersed storage error encoded to produce a set of encoded data slices that are stored in the corresponding set of storage units. A storage unit may be affiliated with two or more vaults. For example, storage units 1 and 16 are associated with the vault 1 and storage unit 16-32 are affiliated with the vault 2. The DSN functions to communicate storage unit task execution status.

In an example of operation of the communicating of the storage unit task execution status, unique multicast Internet protocols (IP) addresses are associated with each of the vaults. The association may result from one or more of a manager assignment, a storage unit self-assignment, set of storage unit self-assignment, or an assignment by any DST processing unit. For example, the vault 1 is associated with the multicast IP address A and the vault 2 is associated with a multicast IP address B in accordance with system registry information as determined by a manager.

With the multicast IP address associations established, when storing data associated with a vault, the DST processing unit 1 identifies a multicast IP address associated with the vault. The identifying includes at least one of assigning, interpreting the system registry information, interpreting a query response, or interpreting a multicast IP address subscription. For example, the DST processing unit 1 identifies the multicast IP address A when the vault is the first vault and identifies the multicast IP address B when the vault is the second vault.

Having identified the multicast IP address (e.g., multicast IP address A), the DST processing unit 1 generates a multicast IP message that includes the multicast IP address, one or more encoded data slices for storage (e.g., slices 1-16), and for each encoded data slice, a corresponding slice name, where the DST processing unit 1 dispersed storage error encodes data A to produce the one or more encoded data slices 1-16. Having generated the multicast IP message, the DST processing unit 1 sends multicast IP message, via the network 24, to the plurality of storage units of the DSN. For example, the DST processing unit 1 transmits a multicast IP address A vault 1 slices 1-16 message to the network 24 for redistribution (e.g., to storage units 1-16 that have subscribed to the multicast IP address A).

Each storage unit receiving the multicast IP message extracts the multicast IP address from the multicast IP message. For example, the storage unit 1 identifies a multicast IP address field of the multicast IP message and retrieves the multicast IP address A from the identified multicast IP address field to extract the multicast IP address A.

When the extracted IP address compares favorably to a subscribed IP address, the storage unit stores the one or more encoded data slices for storage by the storage unit and the corresponding slice name for each encoded data slice. For example, the storage unit 1 indicates a favorable comparison with the extracted IP address A is within a range of the subscribed IP addresses of the storage unit 1, and stores the encoded data slice 1 corresponds to the storage unit 1.

When the extracted IP address compares favorably to the subscribed IP address, the storage unit stores the one or more encoded data slices for storage in the corresponding slice name for each encoded data slice associated with the storage unit. For example, the storage unit 1 stores encoded data slice 1 of the encoded data slices 1-16.

Having successfully stored the one or more encoded data slices, each storage unit issues a status multicast IP message, where the status multicast IP message includes one or more of the multicast IP address associated with the vault, the storage unit identifier, a corresponding one or more slice names, or a status indicator that indicates the successful storage of the one or more encoded data slices for the storage unit. For example, the storage unit 1 generates the status multicast IP message address A vault 1 for storage confirmation of slice 1 and transmits the status multicast IP message to the network 24.

When an extracted IP address of a plurality of received status multicast IP messages compares favorably to a subscribed IP address, the DST processing unit 2 determines whether the plurality of status multicast IP messages indicates successful storage of data in a corresponding vault. The determining includes indicating that the data has been successfully stored in the corresponding vault when a confirmation threshold number (e.g., a write threshold number) of favorable received status multicast IP messages indicates successful storage of slices of the data. For example, the DST processing unit 2 receives a write threshold number of multicast IP address A vault 1 storage confirmation of slices 1-16 and indicates that the data A has storage in the vault 1.

When the data has been successfully stored, DST processing unit 2 facilitates execution of an associated task. The associated task includes one or more of reading the data back, updating a directory, notifying a user device of the successful storage, or deleting the data after a deletion time frame, etc. In an example of the facilitating, the DST processing unit 2 issues read slice requests, for each set of encoded data slices, receives further multicast IP messages that includes a decode threshold number of encoded data slices (e.g., multicast IP address A vault 1 slices 1-10 when the decode threshold number is 10), and disperse storage error decodes the received encoded data slices to produce recovered data A.

Figure 9A:
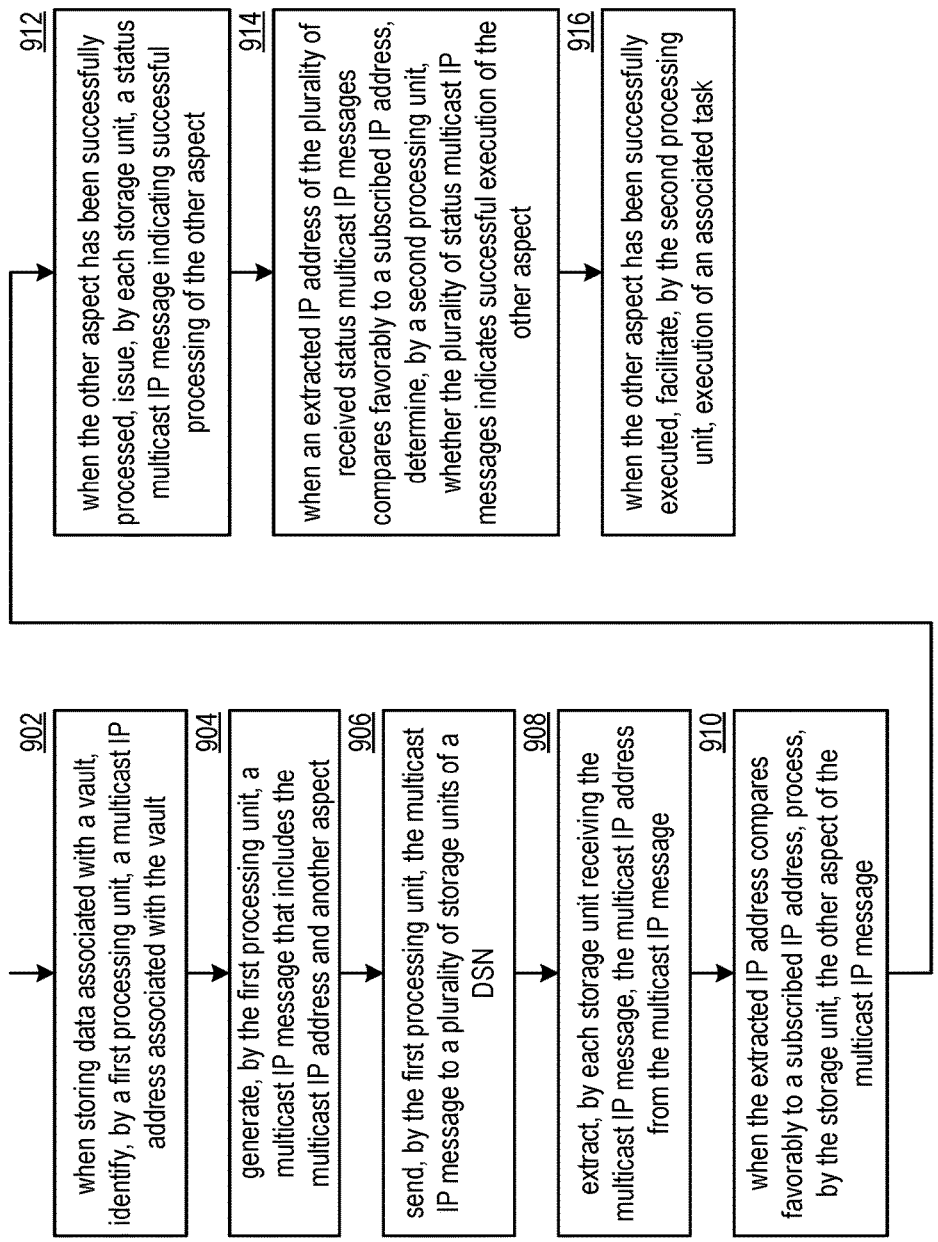
FIG. 9A is a flowchart illustrating an example of communicating storage unit task execution status in accordance with the present invention.

FIG. 9A is a flowchart illustrating an example of communicating storage unit task execution status. In particular, a method is presented for use in conjunction with one or more functions and features described in conjunction with FIGS. 1-2, 3-8, 9 and 9A.

The method includes step 902 where a first processing unit (e.g., of a first distributed storage and task (DST) processing unit), when storing data associated with a vault, identifies a multicast Internet protocol (IP) address associated with the vault. The identifying includes one or more of assigning, interpreting system registry information, interpreting a query response, or interpreting a multicast IP address subscription.

The method continues at step 904 where the first processing unit generates a multicast IP message that includes the multicast IP address and another aspect. Another aspect includes a write slice request that includes an encoded data slice and a slice name, or a read slice request that includes a slice name, etc. The method continues at step 906 where the first processing unit sends the multicast IP message to a plurality of storage units of a dispersed storage network (DSN). For example, first processing unit transmits the multicast IP message via a network to the plurality of storage units. As another example, the first processing unit transmits the multicast IP message to at least one of a router or a switch of the network, where the network forwards the multicast ID message to particular storage units associated with the vault.

The method continues at step 908 where each storage unit receiving the multicast IP message extracts the multicast IP address from the multicast IP message. For example, the storage unit identifies a multicast IP address field of the multicast IP message, and retrieves the multicast IP address from the identified multicast IP address field.

When the extracted IP address compares favorably to a subscribed IP address, the method continues at step 910 where the storage unit processes another aspect of the multicast message. The processing includes indicating a favorable comparison when the extracted IP address is within a range of subscribed IP addresses. Executing the other aspect includes, for example, storing a received encoded data slice when the other aspect is a write slice request, and issuing a read slice response that includes a retrieved encoded data slice when another aspect is a read slice request.

When the other aspect has been successfully processed, the method continues at step 912 where each storage unit issues a status multicast IP message indicating successful processing of another aspect. The issuing includes generating the status multicast IP message to include one or more of the multicast IP address, a storage unit identifier, a corresponding one or more slice names, or a status indicator that indicates successful storage of the one or more encoded data slices when the other aspect is storing slices, and transmitting the status multicast IP message to the network.

When an extracted IP address of the plurality of received status multicast IP messages compares favorably to a subscribed IP address, the method continues at step 914 where a second processing unit determines whether the plurality of status multicast IP messages indicates successful execution of another aspect. Alternatively, the first processing unit performs the determining. The determining includes indicating that the data has been successfully stored in the corresponding vault when a confirmation threshold number (e.g., a write threshold number) of favorable received status multicast IP messages indicates successful storage of slices of the data when the other aspect is storing slices of the data.

When another aspect has been successfully executed, the method continues at step 916 where the second processing unit facilitates execution of an associated task. As an example of the facilitating, the second processing unit issues read slice requests for each set of encoded data slices, receives further multicast IP messages that includes a decode threshold number of encoded data slices, or dispersed storage error decodes the received encoded data slices to produce recovered data when the other aspect includes reading back recently stored data.

The method described above in conjunction with the processing module can alternatively be performed by other modules of the dispersed storage network or by other computing devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:

storing data associated with a vault and identifying a multicast IP address associated with the vault, where the vault includes a set of encoded data slices for each data segment and where a write threshold number is a minimum number, less than a complete set of the encoded data slices, that is required to successfully write to dispersed storage the data segment to a vault of storage units;

generating and sending, by a first DS processing unit, a multicast IP message via a network, to a plurality of storage units of the DSN, wherein the multicast IP message includes the multicast IP address, a plurality of encoded data slices for storage and, for each encoded data slice, a corresponding slice name;

extracting, by each of the plurality of storage units receiving the multicast IP message, the multicast IP address;

for the extracted multicast IP address comparing favorably to a subscribed IP address, storing in each storage unit of the vault of storage units one or more of the plurality of encoded data slices and a corresponding slice name for each encoded data slice, where each storage unit of the vault of storage units stores, based on the corresponding slice name, a respective encoded data slice associated with that storage unit;

after the storing is completed, each of the plurality of storage units issuing a status multicast IP message;

extracting the multicast IP address of a plurality of received status multicast IP messages comparing favorably to a subscribed IP address and determining, by a second DS processing unit, separate from the first DS processing unit, whether the plurality of received status multicast IP messages indicates successful storage of data in a corresponding vault, wherein the determining includes indicating that the data has been successfully stored in the vault of storage units when a confirmation of the write threshold number of favorable received status multicast IP messages indicate successful storage of encoded data slices; and based on the data being successfully stored, facilitating, by the second DS processing unit execution of an associated task.

2. The method of claim 1, wherein each storage unit can see a plurality of multicast IP messages, but filter out all but subscribed IP addresses by one or more of: a vault ID, an object ID, or a slice name range.

3. The method of claim 1, wherein the identifying includes one or more of: assigning, interpreting system registry information, interpreting a query response, or interpreting a multicast IP address subscription.

4. The method of claim 1, wherein the extracting includes one or more of: identifying a multicast IP address field of the multicast IP message or retrieving the multicast IP address from the identified multicast IP address field.

5. The method of claim 1, wherein the extracted IP address compares favorably to a subscribed IP address when the extracted IP address is within a range of a subscribed IP address.

6. The method of claim 1, wherein the status multicast IP message includes one or more of: the multicast IP address associated with the vault, a storage unit identifier, one or more of the corresponding slice name(s), or a status indicator that indicates successful storage of the one or more encoded data slices.

7. The method of claim 1, wherein the issuing includes generating the status multicast IP message and transmit the status multicast IP message to the network.

8. The method of claim 1, wherein the associated task includes one or more of: reading the data back, updating a directory, or notifying a user device.

9. The method of claim 1, wherein the facilitating includes one or more of: issuing read slice requests, for each set of encoded data slices, or receiving additional multicast IP messages that includes a decode threshold number of encoded data slices for decoding to produce recovered data.

10. A computing device of a group of computing devices of a dispersed storage network (DSN), the computing device comprises:
an interface;
a local memory; and
a processing module operably coupled to the interface and the local memory, wherein the processing module functions to:
store data associated with a vault and identify a multicast IP address associated with the vault, where the vault includes a set of encoded data slices for each data segment and where a write threshold number is a minimum number, less than a complete set of the encoded data slices, that is required to successfully write to dispersed storage the data segment to a vault of storage units;
generate and send, by a first DS processing unit, a multicast IP message via a network, to a plurality of storage units of the DSN, wherein the multicast IP message includes the multicast IP address, a plurality of encoded data slices for storage and, for each encoded data slice, a corresponding slice name;
extract, by each of the plurality of storage units receiving the multicast IP message, the multicast IP address;
for the extracted multicast IP address comparing favorably to a subscribed IP address, store in each storage unit of the vault of storage units one or more of the plurality of encoded data slices and a corresponding slice name for each encoded data slice, where each storage unit of the vault of storage units stores, based on the corresponding slice name, a respective encoded data slice associated with that storage unit;
after the storing is completed, each of the plurality of storage units issuing a status multicast IP message;
extracting the multicast IP address of a plurality of received status multicast IP messages comparing favorably to a subscribed IP address and determine, by a second DS processing unit, separate from the first DS processing unit, whether the plurality of received status multicast IP messages indicates successful storage of data in a corresponding vault, wherein the determine step includes indicating that the data has been successfully stored in the vault of storage units when a confirmation of the write threshold number of favorable received status multicast IP messages indicate successful storage of encoded data slices; and
based on the data being successfully stored, facilitate, by the second DS processing unit execution of an associated task.

11. The computing device of claim 10, wherein the extracting includes one or more of: identifying a multicast IP address field of the multicast IP message or retrieving the multicast IP address from the identified multicast IP address field.

12. The computing device of claim 10, wherein the extracted IP address compares favorably to a subscribed IP address when the extracted IP address is within a range of a subscribed IP address.

13. The computing device of claim 10, wherein the status multicast IP message includes one or more of: the multicast IP address associated with the vault, a storage unit identifier, one or more of the corresponding slice names, or a status indicator that indicates successful storage of the one or more encoded data slices.

14. The computing device of claim 10, wherein the associated task includes one or more of: reading the data back, updating a directory, or notifying a user device.

15. A method for execution by one or more processing modules of one or more computing devices of a dispersed storage network (DSN), the method comprises:
storing data associated with a vault, identifying, by a first distributed storage and task (DST) processing unit, a multicast IP address associated with the vault, where the vault includes a set of encoded data slices for each data segment and where a write threshold number is a minimum number, less than a complete set of the encoded data slices, that is required to successfully write to dispersed storage the data segment to a vault of storage units;
generating and sending, by the first DST processing unit, a multicast IP message via a network, to a plurality of storage units of the DSN, wherein the multicast IP message includes the multicast IP address, a plurality of encoded data slices for storage and, for each encoded data slice, a corresponding slice name;

extracting, by each storage unit receiving the multicast IP message, the multicast IP address;

for the extracted multicast IP address comparing favorably to a subscribed IP address, storing, by the storage unit, one or more encoded data slices for storage and a corresponding slice name for each encoded data slice, where each storage unit of the vault of storage units stores, based on the corresponding slice name, a respective encoded data slice associated with that storage unit;

after the storing is completed, each storage unit issuing a status multicast IP message;

extracting the multicast IP address of a plurality of received status multicast IP messages comparing favorably to a subscribed IP address and determining, by a second DST processing unit, separate from the first DST processing unit, whether the plurality of received status multicast IP messages indicates successful storage of data in a corresponding vault, wherein the determining includes indicating that the data has been successfully stored in the vault of storage units when a confirmation of the write threshold number of favorable received status multicast IP messages indicate successful storage of encoded data slices; and based on the data being successfully stored, facilitating, by the second DST processing unit execution of an associated task.

16. The method of claim 15, wherein the associated task includes one or more of: reading the data back, updating a directory, or notifying a user device.

* * * * *